United States Patent
Wang et al.

(10) Patent No.: US 10,937,850 B2
(45) Date of Patent: Mar. 2, 2021

(54) OLED DISPLAY PANEL, MANUFACTURING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Junyuan Wang, Hubei (CN); Jiajia Sun, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/607,726

(22) PCT Filed: May 30, 2019

(86) PCT No.: PCT/CN2019/089165
§ 371 (c)(1),
(2) Date: Oct. 24, 2019

(87) PCT Pub. No.: WO2020/220426
PCT Pub. Date: Nov. 5, 2020

(65) Prior Publication Data
US 2020/0350385 A1 Nov. 5, 2020

(30) Foreign Application Priority Data
Apr. 30, 2019 (CN) .......................... 201910364759.0

(51) Int. Cl.
H01L 27/32 (2006.01)
G06F 3/041 (2006.01)
(Continued)

(52) U.S. Cl.
CPC ........ H01L 27/3272 (2013.01); G06F 3/0412 (2013.01); H01L 27/323 (2013.01);
(Continued)

(58) Field of Classification Search
CPC ........... H01L 27/323; H01L 2251/5338; H01L 2924/3025; H01L 23/60
See application file for complete search history.

(56) References Cited

U.S. PATENT DOCUMENTS

| 9,871,005 B2 * | 1/2018 | Lin ....................... H01L 23/552 |
| 2013/0033452 A1 * | 2/2013 | Fukushima ......... G02F 1/13338 345/174 |

(Continued)

FOREIGN PATENT DOCUMENTS

| CN | 104020880 A | 9/2014 |
| CN | 107656641 A | 2/2018 |

(Continued)

*Primary Examiner* — Jonathan Han
(74) *Attorney, Agent, or Firm* — Mark M. Friedman

(57) ABSTRACT

The present invention provides an organic light-emitting diode (OLED) display panel, a manufacturing method of the OLED display panel, and a display device. The OLED display panel includes a substrate, an OLED light-emitting device, a first encapsulating layer, an electromagnetic interference (EMI) shielding cover, a second encapsulating layer, and a touch electrode. The OLED light-emitting device is arranged on the substrate. The first encapsulating layer covers the OLED light-emitting device. The EMI shielding cover encloses the first encapsulating layer and the OLED light-emitting device. The second encapsulating layer covers the EMI shielding cover. The touch electrode is arranged on the second encapsulating layer.

13 Claims, 4 Drawing Sheets

(51) Int. Cl.
*H05K 9/00* (2006.01)
*H01L 51/52* (2006.01)
*H01L 51/56* (2006.01)

(52) U.S. Cl.
CPC .......... *H01L 51/5237* (2013.01); *H01L 51/56* (2013.01); *H05K 9/0081* (2013.01); *G06F 2203/04107* (2013.01)

(56) References Cited

U.S. PATENT DOCUMENTS

| | | | |
|---|---|---|---|
| 2015/0351293 | A1 | 12/2015 | Ma |
| 2016/0066481 | A1* | 3/2016 | Malek .................... H05K 1/181 361/760 |
| 2016/0103536 | A1* | 4/2016 | Xiong ................... G06F 3/0412 345/173 |
| 2017/0263569 | A1* | 9/2017 | Sommer ............... H01L 21/268 |
| 2018/0166507 | A1 | 6/2018 | Hwang et al. |
| 2019/0087041 | A1 | 3/2019 | Shi |

FOREIGN PATENT DOCUMENTS

| | | |
|---|---|---|
| CN | 108227978 A | 6/2018 |
| CN | 207503186 U | 6/2018 |
| CN | 108493351 A | 9/2018 |

* cited by examiner

OLED DISPLAY PANEL, MANUFACTURING METHOD THEREOF, AND DISPLAY DEVICE

FIELD OF DISCLOSURE

The present invention relates to a field of display devices and in particular, to an organic light-emitting diode (OLED) display panel, a manufacturing method thereof, and a display device.

DESCRIPTION OF RELATED ART

Organic light-emitting diode (OLED) display panels are an important research direction for industries and scientists in the field of display devices. At present, remarkable results have been achieved for small-sized and large-sized panels, and OLED displays gradually replace current liquid crystal displays (LCDs).

Conventional OLED display panels adopt a thin film encapsulation (TFE) film layer, so that OLED light-emitting devices have flexible OLED displays. In order to make flexibility of OLED light-emitting devices less effected by its neutral plane and overall thickness, conventional techniques usually reduce a thickness of the TFE film layer.

A direct on-cell touch (DOT) technology is to set a touch electrode on the TFE film layer. When a thickness of the TFE film layer is reduced to a certain extent, electrodes in the OLED light-emitting device are easily interfered by adjacent touch electrodes due to charge induction, which affects a normal display function of the OLED light-emitting device. A signal interference problem between touch electrodes and electrodes in an OLED light-emitting device is caused by thinning of a thin film encapsulation (TFE) film layer.

SUMMARY

The present invention provides an organic light-emitting diode (OLED) display panel. The OLED display panel comprises a substrate, an OLED light-emitting device, a first encapsulating layer, an electromagnetic interference (EMI) shielding cover, a second encapsulating layer, and a touch electrode. The OLED light-emitting device is disposed on the substrate. The first encapsulating layer covers the OLED light-emitting device. The EMI shielding cover encloses the first encapsulating layer and the OLED light-emitting device. The second encapsulating layer covers the EMI shielding cover. The touch electrode is disposed on the second encapsulating layer.

The present invention further provides a display device. The display device comprises an integrated circuit and the above-mentioned OLED display panel.

The present invention provides a manufacturing method of an organic light-emitting diode (OLED) display panel, comprising:

providing a substrate;

forming on the substrate an OLED light-emitting device, a first encapsulating layer, and an electromagnetic interference (EMI) shielding cover, wherein the first encapsulating layer covers the OLED light-emitting device, and the EMI shielding cover encloses the first encapsulating layer and the OLED light-emitting device;

forming a second encapsulating layer covering the EMI shielding cover; and forming a touch electrode on the second encapsulating layer.

Advantages of the Present Invention

The present invention utilizes the EMI shielding cover to enclose the OLED light-emitting device. No matter how much the TFE film layer is thinned, the EMI shielding cover can prevent signal interference between the touch electrode and the electrode in the OLED light-emitting device.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Technical solutions of various embodiments of the present invention will be clearly and completely described below with reference to the accompanying drawings. The embodiments mentioned below and their technical features can be combined with one another if no conflicts will be made.

Directional terms mentioned in the present disclosure, such as "up", "down", "top", "bottom", "front", "rear", "left", "right", "inside", "outside", "side", "surrounding", "center", "horizontal", "transverse", "vertical", "longitudinal", "axial", "radial", "an uppermost layer", or "a lowermost layer", are only illustrative with reference to the accompanying drawings. The directional terms are used for illustration and ease of understanding of the present disclosure.

Figure 1:
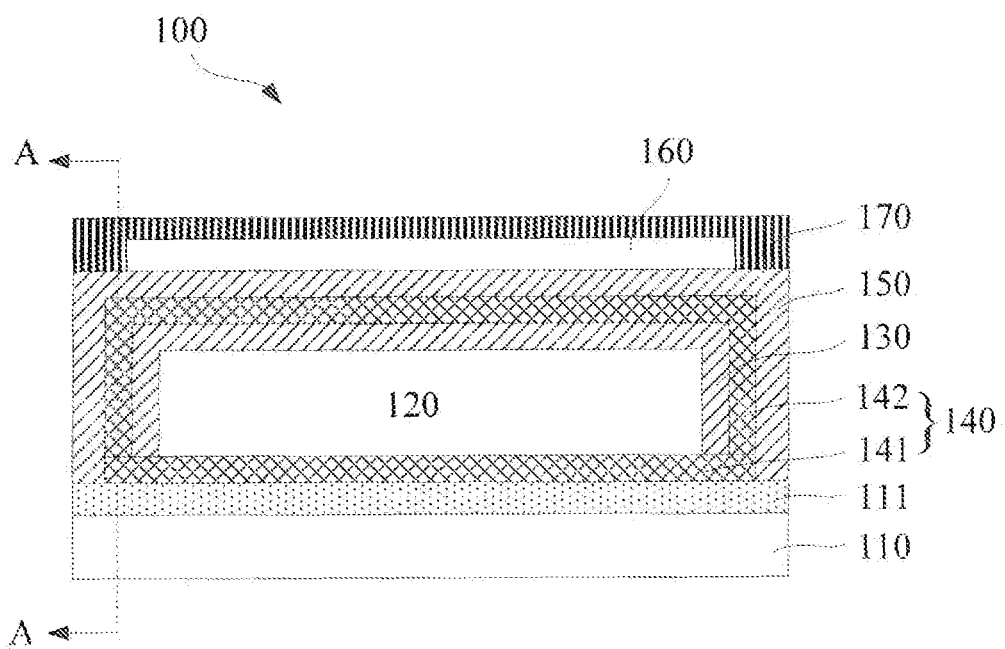
FIG. 1 is a schematic structural view illustrating an organic light-emitting diode (OLED) display panel according to one embodiment of the present invention.

FIG. 1 is a schematic structural view illustrating an organic light-emitting diode (OLED) display panel according to one embodiment of the present invention. As shown in FIG. 1, the OLED display panel 100 comprises a substrate 110, an OLED light-emitting device 120, a first encapsulating layer 130, an electromagnetic interference (EMI) shielding cover 140, a second encapsulating layer 150, and a touch electrode 160.

The OLED light-emitting device 120 is disposed on the substrate 110. The first encapsulating layer 130 covers the OLED light-emitting device 120. The EMI shielding cover 140 encloses the first encapsulating layer 130 and the OLED light-emitting device 120. The second encapsulating layer 150 covers the EMI shielding cover 140. The touch electrode 160 is disposed on the second encapsulating layer 150.

The first encapsulating layer 130 and the second encapsulating layer 150 can be regarded as a thin film encapsulation (TFE) film layer.

The OLED display panel 100 encloses the OLED light-emitting device 120 by the EMI shielding cover 140. The EMI shielding cover 140 can certainly reduce signal interference between the touch electrode 160 and an electrode of the OLED light-emitting device regardless how much the TFE film layer is thinned.

In detail, the EMI shielding cover 140 has an EMI shielding function, and a material of the EMI shielding cover 140 comprises any combination selected from metal, metal alloy, and a non-metal conductive material, wherein the metal includes, but is not limited to, Al, Ag, Cu, and Mg, the metal alloy may be alloy of two or more metals, and the non-metal conductive material may be indium tin oxide (ITO) or etc.

Referring to FIG. 1, according to one embodiment, the EMI shielding cover 140 can include a first hollow conductive layer 141 and a second hollow conductive layer 142 that are connected to form a relatively-closed EMI shielding cover 140. Configuration of the first hollow conductive layer 141 and the second hollow conductive layer 142 will be described below in conjunction with a detailed structure of the OLED display panel 100.

The substrate 110 is a base substrate of the OLED display panel 100 for carrying various structural layers and electronic components of the OLED display panel 100. In order to adapt to flexibility of the OLED display panel 100, the substrate 110 is a flexible sheet member which is bendable, and its main material includes, but is not limited to, polyimide (PI).

The substrate 110 is selectively covered with a buffer layer 111 to prevent entry of moisture and oxygen, and a main material of the buffer layer 111 includes, but is not limited to, silicon nitride (SiNx), silicon oxide (SiOx), and silicon oxynitride (SiOxNy). In addition, the buffer layer 111 has a thickness ranging from 500 to 1000 nanometers. Hereinafter, the buffer layer 111 is disposed on the substrate 110 as an example, and the first hollow conductive layer 141 is disposed on the buffer layer 111. Certainly, in a case where no buffer layers 111 are provided in the OLED display panel 100, the first hollow conductive layer 141 is directly disposed on the substrate 110.

Figure 2:
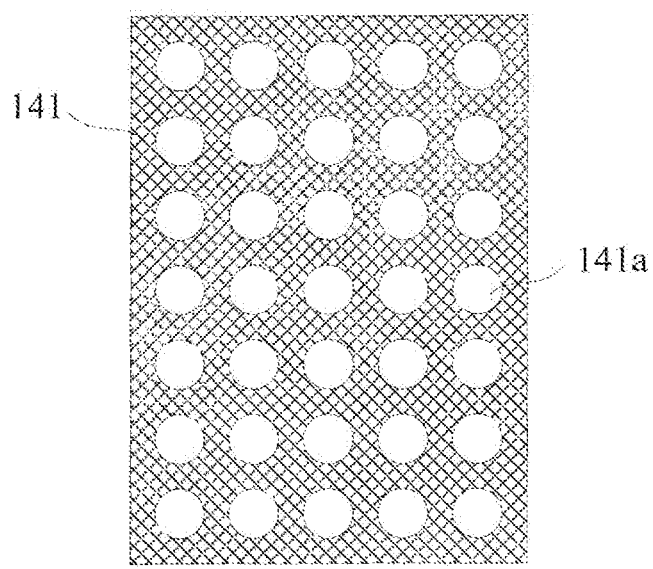
FIG. 2 is a top view illustrating a first hollow conductive layer according to a first embodiment of the present invention.
Figure 3:
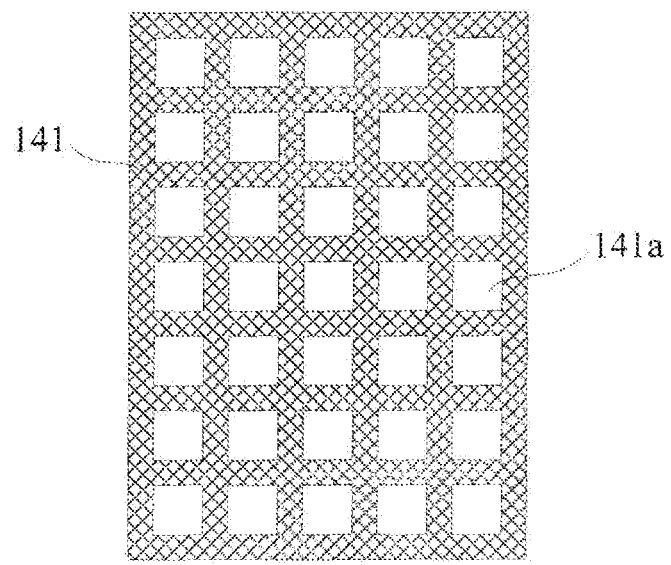
FIG. 3 is a bottom view illustrating the first hollow conductive layer according to a second embodiment of the present invention.

The first hollow conductive layer 141 may be made of metal such as Al, Ag, Cu, Mg, alloy of two or more metals, or a non-metal conductive material like ITO. In addition, a thickness of the first hollow conductive layer 141 may range from 5 to 100 nanometers. In the present disclosure, the first hollow conductive layer 141 is a layer structure provided with hollow regions. As shown in FIG. 2, the hollow regions 141a can be circular holes, or these hollow regions 141a can be square holes as shown in FIG. 3. Of course, these hollow regions 141a may have a same polygonal shape such as a diamond shape or may each have a polygonal shape selected from a combination of two or more polygonal shapes. In addition, a dimension of each hollow region 141a may range from 10 to 1000 nanometers, and a distance between adjacent two hollow regions 141a may range from 10 and 1000 nanometers.

In one embodiment, a conductive layer is formed by physical vapor deposition (PVD), pulsed laser deposition (PLD), magnetron sputtering, or the like, and then a photo-mask process and an etching process are used to form hollow regions 141a in a conductive layer, thereby forming the first hollow conductive layer 141.

The OLED light-emitting device 120 may comprise a control circuit layer (also referred to as an array circuit layer), an anode, an OLED light-emitting layer, and a cathode sequentially disposed on the buffer layer 111. The control circuit layer is configured to control the OLED light-emitting device 120 to emit light and is disposed on the first hollow conductive layer 141. The first encapsulating layer 130 covers the cathode and is extended to lateral sides of the OLED light-emitting device 120 to encapsulate the OLED light-emitting device 120 on the first hollow conductive layer 141. The first encapsulating layer 130 can prevent entry of water and oxygen and can be made of an inorganic material.

The second hollow conductive layer 142 is disposed on the first encapsulating layer 130, and the second hollow conductive layer 142 is extended to the lateral sides of the OLED light-emitting device 120 and connected to the first hollow conductive layer 141 to form the EMI shielding cover 140. The second hollow conductive layer 142 and the first hollow conductive layer 141 may be the same in material, their manufacturing process, and the hollow regions.

Figure 4:
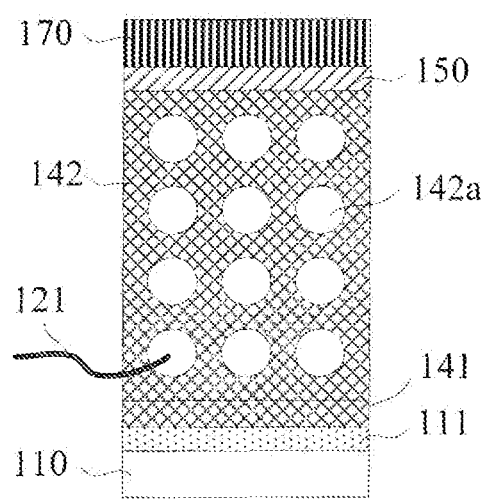
FIG. 4 is a cross-sectional structural view, taken along A-A direction of FIG. 1, illustrating the OLED display panel according to a first embodiment of the present invention.

In practice, the OLED light-emitting device 120 needs to be connected to an integrated circuit (IC) and receives signals from the integrated circuit to realize illuminating. Therefore, the OLED light-emitting device 120 is provided with a conductive element extended toward the integrated circuit. The conductive element is, for example, a metal wire. In one embodiment, as shown in FIG. 4, the conductive element 121 may be inserted through the hollow region 142a on one side of the second hollow conductive layer 142 and is connected to the integrated circuit. The conductive element 121 does not contact side-walls of the hollow region 142a through which the conductive element 121 is inserted, so the conductive element 121 is electrically insulated from the EMI shielding cover 140.

Figure 5:
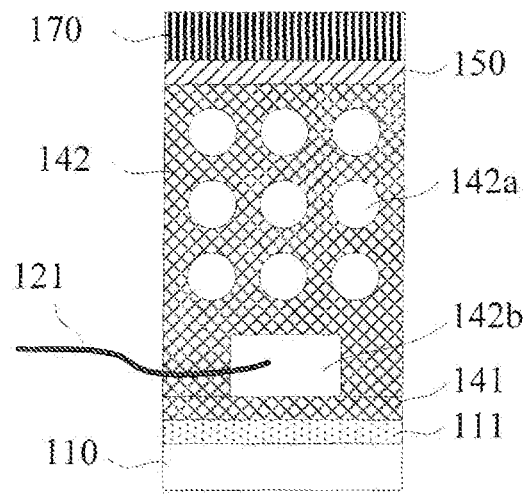
FIG. 5 is a cross-sectional structural view, taken along A-A direction of FIG. 1, illustrating the OLED display panel according to a second embodiment of the present invention.

In another embodiment, as shown in FIG. 5, the second hollow conductive layer 142 may be provided with a through hole 142b at one side adjacent to the integrated circuit, and the conductive element 121 is inserted through the through hole 142b and is connected to the integrated circuit. The conductive element 121 does not contact side-walls of the through hole 142b and thereby is electrically insulated from the EMI shielding cover 140.

The second encapsulating layer 150 covers the second hollow conductive layer 142 and is extended to lateral sides of the EMI shielding cover 140 to encapsulate the EMI shielding cover 140 on the buffer layer 111. The second encapsulating layer 150 has a function for preventing entry of water and oxygen and can be made of an inorganic material. The second encapsulating layer 150 and the first encapsulating layer 130 may be the same in material and their manufacturing process.

The touch electrode 160 is disposed on the second encapsulating layer 150, so that touch detection of the OLED display panel 100 can be realized. The structure can refer to conventional techniques. In addition, the touch electrode 160 can be made of a transparent conductive material such as indium tin oxide.

Further, the OLED display panel 100 may include a protective layer 170 covering the touch electrode 160 and extended to the second encapsulating layer 150. The touch electrode 160 is encapsulated on the second encapsulating layer 150 to protect the touch electrode 160. The protective layer 170 may be the same as the first encapsulating layer 130 or the second encapsulation layer 150 in terms of material and their manufacturing process.

The OLED display panel 100 can prevent signal interference between the touch electrode 160 and the electrode (e.g., a cathode and an array circuit) in the OLED light-emitting device 120 by using the EMI shielding cover 140, so that signal interference between the touch electrode 160 and the electrode in the OLED light-emitting device 120 caused by thinning of the TFE film layer is significantly reduced.

The present invention also provides a display device. The display device comprises an integrated circuit and an OLED display panel connected to the integrated circuit. The OLED display panel may have a structure the same as the OLED display panel 100 of any of the above-mentioned embodiments, and thus the display device can prevent signal interference between the touch electrode and the electrode in the OLED light-emitting device by using the EMI shielding cover, thereby effectively reducing signal interference between the touch electrode and the electrode in the OLED light-emitting device caused by thinning of the TFE film layer.

In one embodiment, the EMI shielding cover 140 may be extended to the integrated circuit. For example, the first hollow conductive layer 141 and the second hollow conductive layer 142 are extended from one side to the integrated circuit and is connected to the zero electrical potential line of the integrated circuit. The zero electrical potential line can be a ground line. Charges accumulated on the EMI shielding cover 140 can be transmitted to the ground through a zero electrical potential line.

Figure 6:
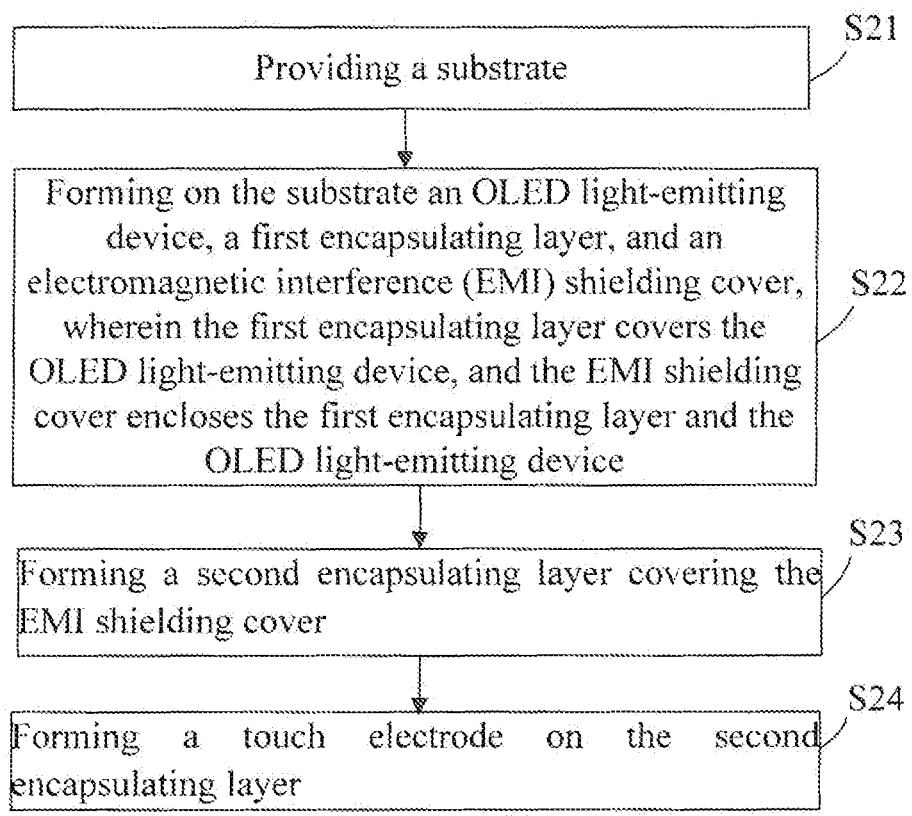
FIG. 6 is a process flow diagram illustrating a manufacturing method of an OLED display panel according to one embodiment of the present invention.

FIG. 6 is a process flow diagram illustrating a manufacturing method of an OLED display panel according to one embodiment of the present invention. The manufacturing method comprises steps S21 to S24 as follows.

S21: providing a substrate;

S22: forming on the substrate an OLED light-emitting device, a first encapsulating layer, and an electromagnetic interference (EMI) shielding cover, wherein the first encapsulating layer covers the OLED light-emitting device, and the EMI shielding cover encloses the first encapsulating layer and the OLED light-emitting device;

S23: forming a second encapsulating layer covering the EMI shielding cover; and

S24: forming a touch electrode on the second encapsulating layer.

The first encapsulating layer and the second encapsulating layer can be regarded as a TFE film layer.

The manufacturing method encloses the OLED light-emitting device by having an EMI shielding cover. The EMI shielding cover can prevent signal interference between the touch electrode and the electrode in the OLED light-emitting device regardless of how much the TFE film layer is thinned.

The EMI shielding cover produced by using the above manufacturing method has an EMI shielding function. In one embodiment, the EMI shielding cover comprises a first hollow conductive layer and a second hollow conductive layer, and the two hollow conductive layers are connected to each other to form a relatively-closed EMI shielding cover. On this basis, the manufacturing method of the OLED display panel further comprises steps shown in FIG. 7.

Figure 7:
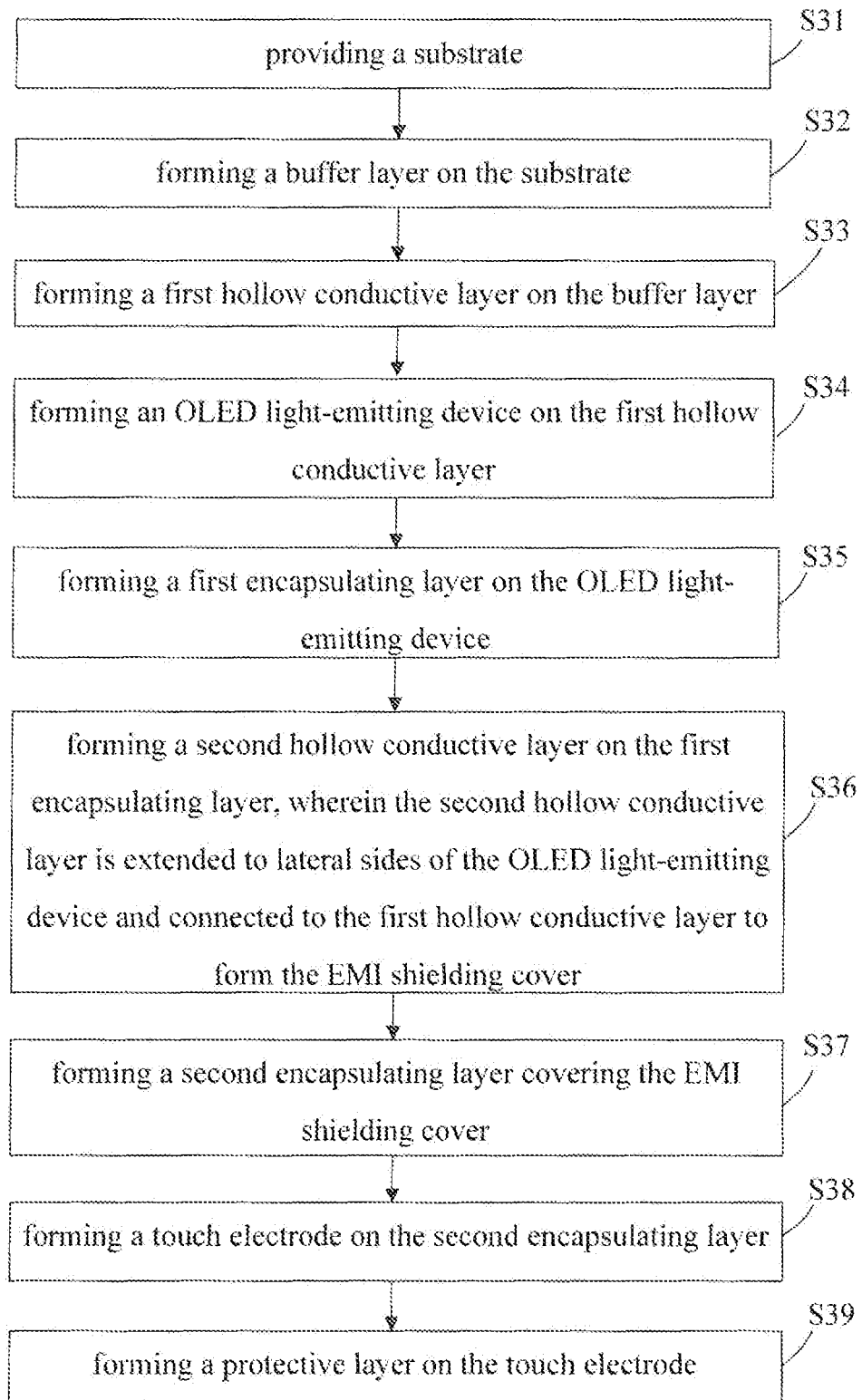
FIG. 7 is a process flow diagram illustrating the manufacturing method of the OLED display panel according to another embodiment of the present invention.

FIG. 7 is a process flow diagram illustrating a manufacturing method of an OLED display panel according to another embodiment of the present invention. As shown in FIG. 7, the manufacturing method comprises steps S31 to S39 as follows.

S31: providing a substrate;

S32: forming a buffer layer on the substrate;

S33: forming a first hollow conductive layer on the buffer layer;

S34: forming an OLED light-emitting device on the first hollow conductive layer;

S35: forming a first encapsulating layer on the OLED light-emitting device;

S36: forming a second hollow conductive layer on the first encapsulating layer, wherein the second hollow conductive layer is extended to lateral sides of the OLED light-emitting device and connected to the first hollow conductive layer to form the EMI shielding cover;

S37: forming a second encapsulating layer covering the EMI shielding cover;

S38: forming a touch electrode on the second encapsulating layer; and

S39: forming a protective layer on the touch electrode.

The manufacturing method can be used to manufacture the above-mentioned OLED display panel 100. Components and structural elements produced by using the manufacturing method is mentioned above, so a detailed description is not repeated herein for brevity.

The manufacturing method of the OLED display panel prevents signal interference between the touch electrode and the electrode in the OLED light-emitting device by using the EMI shielding cover, thus effectively reducing signal interference between the touch electrode and the electrode in the OLED light-emitting device caused by thinning of the TFE film layer.

Although the present invention has been described with reference to one or more embodiments, equivalent changes and modifications will be apparent to those of ordinary skill in the art. All such changes and modifications are deemed to be within the protection scope of the claims. Regarding the various functions performed by the above-described components, wordings used to describe such components are intended to describe any component (unless otherwise specifically indicated) that performs the specified function (e.g., functionally equivalent components), even if that component is structurally not identical to the disclosed structure for performing the function in the example embodiment of the present specification. Moreover, although specific features of the specification have been disclosed in one embodiment among various possible embodiments, such features, may be combined with one or more other features in different embodiments which can be used to achieve a particular implementation. Furthermore, the terms "including," "having," or "containing" used in the embodiments or claims are intended to a meaning similar to the term "comprising," Further, it should be understood that "multiple" referred to herein means two or more. For the steps mentioned in the text, the step numbers are only for the purpose of clearly expressing the embodiment and ease of understanding, and does not completely represent an execution order of the steps.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. An organic light-emitting diode (OLED) display panel, comprising:
   a substrate;
   an OLED light-emitting device disposed on the substrate;
   a first encapsulating layer covering the OLED light-emitting device;

an electromagnetic interference (EMI) shielding cover enclosing the first encapsulating layer and the OLED light-emitting device;

a second encapsulating layer covering the EMI shielding cover; and a touch electrode disposed on the second encapsulating layer;

wherein the EMI shielding cover comprises a first hollow conductive layer and a second hollow conductive layer, the first hollow conductive layer is disposed between the OLED light-emitting device and the substrate, the second hollow conductive layer is disposed on the first encapsulating layer, and the second hollow conductive layer extends to lateral sides of the OLED light-emitting device and connected to the first hollow conductive layer to form an enclosing shape of the EMI shielding cover.

2. The OLED display panel according to claim 1, wherein the OLED light-emitting device includes a conductive element configured to connect an integrated circuit, the conductive element is inserted through a hollow region of the second hollow conductive layer and is electrically insulated from the EMI shielding cover.

3. The OLED display panel according to claim 1, wherein the OLED light-emitting device comprises a conductive element configured to connect an integrated circuit, the second hollow conductive layer is provided with a through hole at one side adjacent to the integrated circuit, and the conductive element is inserted through the through hole and is electrically insulated from the EMI shielding cover.

4. The OLED display panel according to claim 1, wherein a dimension of a hollow region of the first hollow conductive layer and a dimension of a hollow region of the second hollow conductive layer range from 10 to 1000 nm, and a distance between each two adjacent ones of the hollow regions ranges from 10 to 1000 nm.

5. The OLED display panel according to claim 1, wherein a material of the EMI shielding cover comprises any combination selected from metal, metal alloy, and a non-metal conductive material.

6. A display device, the display device comprising an integrated circuit and an organic light-emitting diode (OLED) display panel connected to the integrated circuit, the OLED display panel comprising:
a substrate;
an OLED light-emitting device disposed on the substrate;
a first encapsulating layer covering the OLED light-emitting device;
an electromagnetic interference (EMI) shielding cover enclosing the first encapsulating layer and the OLED light-emitting device;
a second encapsulating layer covering the EMI shielding cover; and
a touch electrode disposed on the second encapsulating layer;
wherein the EMI shielding cover comprises a first hollow conductive layer and a second hollow conductive layer, the first hollow conductive layer is disposed between the OLED light-emitting device and the substrate, the second hollow conductive layer is disposed on the first encapsulating layer, and the second hollow conductive layer extends to lateral sides of the OLED light-emitting device and connected to the first hollow conductive layer to form an enclosing shape of the EMI shielding cover.

7. The display device according to claim 6, wherein the EMI shielding cover of the OLED display panel is connected to a zero electrical potential line of the integrated circuit.

8. The display device according to claim 6, wherein the OLED light-emitting device comprises a conductive element configured to connect an integrated circuit, the conductive element is inserted through a hollow region of the second hollow conductive layer and electrically insulated from the EMI shielding cover.

9. The display device according to claim 6, wherein the OLED light-emitting device comprises a conductive element configured to connect an integrated circuit, the second hollow conductive layer is provided with a through hole at one side adjacent to the integrated circuit, and the conductive element is inserted through the through hole and electrically insulated from the EMI shielding cover.

10. The display device according to claim 6, wherein a dimension of a hollow region of the first hollow conductive layer and a dimension of a hollow region of the second hollow conductive layer range from 10 to 1000 nm, and a distance between each two adjacent ones of the hollow regions ranges from 10 to 1000 nm.

11. The display device according to claim 6, wherein a material of the EMI shielding cover comprises any combination selected from metal, metal alloy, and a non-metal conductive material.

12. A manufacturing method of an organic light-emitting diode (OLED) display panel, comprising:
providing a substrate;
forming on the substrate an OLED light-emitting device, a first encapsulating layer, and an electromagnetic interference (EMI) shielding cover, wherein the first encapsulating layer covers the OLED light-emitting device, and the EMI shielding cover encloses the first encapsulating layer and the OLED light-emitting device;
forming a second encapsulating layer covering the EMI shielding cover; and
forming a touch electrode on the second encapsulating layer;
wherein the EMI shielding cover encloses the first encapsulating layer and the OLED light-emitting device further comprises:
forming a first hollow conductive layer, the first hollow conductive layer formed between the OLED light-emitting device and the substrate; and
forming a second hollow conductive layer on the first encapsulating layer, wherein the second hollow conductive layer extends to lateral sides of the OLED light-emitting device and connected to the first hollow conductive layer to form an enclosing shape of the EMI shielding cover.

13. The manufacturing method of the OLED display panel according to claim 12, wherein forming on the substrate the OLED light-emitting device, the first encapsulating layer, and the EMI shielding cover comprises:
forming a first hollow conductive layer on the substrate;
forming the OLED light-emitting device on the first hollow conductive layer;
forming a first encapsulating layer on the OLED light-emitting device; and
forming a second hollow conductive layer on the first encapsulating layer, wherein the second hollow conductive layer is extends to lateral sides of the OLED light-emitting device and connected to the first hollow conductive layer to form the EMI shielding cover.

\* \* \* \* \*